United States Patent
Tsai

(10) Patent No.: US 7,993,970 B2
(45) Date of Patent: Aug. 9, 2011

(54) SEMICONDUCTOR DEVICE AND FABRICATION METHOD THEREOF

(75) Inventor: Shiann-Tsong Tsai, Hsinchu (TW)

(73) Assignee: UTAC (Taiwan) Corporation, Hsinchu (TW)

( * ) Notice: Subject to any disclaimer, the term of this patent is extended or adjusted under 35 U.S.C. 154(b) by 0 days.

(21) Appl. No.: 12/412,444

(22) Filed: Mar. 27, 2009

(65) Prior Publication Data

US 2009/0243096 A1   Oct. 1, 2009

(30) Foreign Application Priority Data

Mar. 28, 2008 (TW) .............................. 97111224 A
Jun. 17, 2008 (TW) .............................. 97122489 A

(51) Int. Cl.
*H01L 21/00* (2006.01)

(52) U.S. Cl. ........ 438/108; 438/455; 438/613; 438/615; 438/616; 438/745; 257/E21.503; 257/E21.508; 257/E21.51

(58) Field of Classification Search .................. 438/108, 438/455, 613, 615, 616, 745; 257/E21.053, 257/E21.508, E21.51
See application file for complete search history.

(56) References Cited

U.S. PATENT DOCUMENTS

| | | | | |
|---|---|---|---|---|
| 2002/0050652 | A1* | 5/2002 | Akram et al. | 257/783 |
| 2003/0001286 | A1* | 1/2003 | Kajiwara et al. | 257/778 |
| 2004/0164426 | A1* | 8/2004 | Pai et al. | 257/778 |
| 2004/0212101 | A1* | 10/2004 | Pendse | 257/781 |

* cited by examiner

*Primary Examiner* — Michelle Estrada
(74) *Attorney, Agent, or Firm* — Steven M. Jensen; Peter F. Corless; Edwards Angell Palmer & Dodge LLP

(57) ABSTRACT

A semiconductor device and a method of manufacturing the same are disclosed. The method is carried out by forming solder pads on a substrate by wet etching, flipping a semiconductor chip having a plurality of connection bumps formed on an active surface of the semiconductor chip for the connection bumps to be mounted by compression on the solder pads of the substrate correspondingly, at a temperature of the compression between the connection bumps and the solder pads lower than the melting points of the solder pads and the connection bumps, so as to allow the semiconductor chip to be engaged with and electrically connected to the substrate through the connection bumps and the solder pads, thereby enhancing the bonding strength of the solder pads and the connection bumps and increasing the fabrication reliability.

14 Claims, 4 Drawing Sheets

SEMICONDUCTOR DEVICE AND FABRICATION METHOD THEREOF

FIELD OF THE INVENTION

The present invention relates to semiconductor devices and fabrication methods thereof, and more particularly, to a flip-chip type of semiconductor device and a fabrication method thereof.

BACKGROUND OF THE INVENTION

Semiconductor devices have been applied to communication systems, networks, computers, electronic appliances, business machines, cameras, or even game machines. There is a great demand for semiconductor devices in various applications, such as industrial machines, peripheral tools and portable machines. With the rapid development of electronic industry, a semiconductor device is required to have a compact size, multiple pins and a low profile, without compromising functionalities and fabrication cost.

In order to achieve the objectives of having a compact size, multiple pins and a low profile, a flip-chip type of semiconductor device, which is derived from a conventional wire bonding type of semiconductor device having gold wires to connect a substrate with a chip, is designed to have no gold wires and is becoming the main stream of semiconductor device.

As shown in FIG. 1, a metal bump 210 is formed on a chip pad 201 of a chip 200, to electrically connect a solder pad 101 of a substrate 100 to the chip pad 201 of the chip 200 by heat melting or compressing processes. Typically, the solder pad 101 is formed by a circuit patterning process, such as a dry etching process and a wet etching process. The dry etching process ensures that the solder pad 101 has a precise size, but it is time-consuming. Therefore, the wet etching process, which has the advantages of low costs and fast fabrication, is becoming more popular in the circuit patterning process.

The wet etching process employs a strong acid or strong alkali etchant to perform a chemical reaction on surface molecules on a metal layer to be etched by diffusion effect, so as to complete an etching removal. However, with the wet etching process being an isotropic etching process and the metal layer being in contact with the etchant during the wet etching process, a circuitry formed on the metal layer is severely deformed. Hence, with a semiconductor chip being mounted on the substrate 100 and the solder pad 101 and the chip pad 201 being compressed, the metal bump 210 is likely to be of a flat shape due to the compression, as shown in FIG. 2. Thus, the bonding strength between the solder pad 101 and the chip pad 201 is reduced. The time taken for the metal layer to come into contact with the etchant can be reduced by increasing the etching rate, but the metal layer has to be of a reduced thickness accordingly. The metal layer is confronted with a reliability problem such as the ease strip of the circuitry.

Therefore, it is desirable to provide a substrate having its solder pads well connected so as to overcome the drawbacks of the prior art.

SUMMARY OF THE INVENTION

In view of the foregoing drawbacks associated with the conventional technology, a primary objective of the present invention is to provide a semiconductor device and a fabrication method thereof that can improve the wet etching technique.

Another objective of the invention is to provide a semiconductor device and a fabrication method thereof that can avoid increased costs and poor etching selectivity as encountered in the dry etching technique.

Still another objective of the invention is to provide a semiconductor device and a fabrication method thereof that can increase reliability in the manufacturing process.

Another objective of the invention is to provide a semiconductor device and a fabrication method thereof that enable the bonding between the substrate and the chip to be strengthened.

In order to achieve the foregoing and other objectives, the present invention proposes a semiconductor device and a fabrication method thereof, the method comprising the steps of: providing a semiconductor chip having an inner circuit and a plurality of connection bumps electrically connected to the inner circuit, and a substrate having a plurality of solder pads formed by wet etching a conductive metal layer for being electrically connected to the connection bumps; flipping the semiconductor chip to enable the connection bumps to correspond to the solder pads in position; and compressing the substrate and the semiconductor chip toward each other at a temperature of the compression between the connection bumps and the solder pads lower than the melting points of the solder pads and the connection bumps, such that the solder pads are embedded into the connection bumps.

In an embodiment, the method includes the steps of: providing a core board and forming a plurality of solder pads on the core board by wet etching; and providing a semiconductor chip with an active surface having a plurality of connection bumps thereon, the semiconductor chip being electrically connected to the substrate by compressing the connection bumps and the solder pads at a temperature of the compression between the connection bumps and the solder pads lower than the melting points of the solder pads and the connection bumps.

In another embodiment, the method includes the steps of: providing a core board and forming a metal layer on the core board; forming on the metal layer a photoresist layer having a plurality of openings for exposing the metal layer; removing the metal layer exposed from the openings by etching solution, removing the photoresist layer, so as to form a plurality of solder pads on the core board, wherein a top surface of each of the solder pads is smaller in area than a bottom surface of each of the solder pads in order to form a substrate structure; and providing a semiconductor chip with an active surface having a plurality of connection bumps larger than the solder pads, allowing the semiconductor chip to be electrically connected to the substrate by compressing the connection bumps and the solder pads toward each other at a temperature of the compression between the connection bumps and the solder pads lower than the melting points of the solder pads and the connection bumps, so as to engage the connection bumps with the solder pads.

Further, the present invention discloses a semiconductor device including: a semiconductor chip having an inner circuit and a plurality of connection bumps for electrically connecting the inner circuit; and a substrate having a plurality of solder pads for electrically connecting the connection bumps, allowing the semiconductor chip and the substrate to be electrically connected to each other by compression between the connection bumps and the solder pads, wherein the solder pads are made of a conductive metal with a rigidity higher than that of the connection bumps and formed on the substrate by wet etching, so as for the solder pads to be embedded into the connection bumps upon completion of the compression, and a temperature of the compression between the connection bumps and the solder pads is lower than melting points of the solder pads and the connection bumps.

In an embodiment, a top surface of each of the solder pads is smaller in area than a bottom surface of each of the solder pads, and the connection bumps are larger than the solder pads of the substrate in size. In practice, each of the connection bumps has a first contact end, and each of the solder pads has a second contact end corresponding to the first contact end in position and smaller in area than the first contact end.

Therefore, the semiconductor device and the fabrication method thereof form solder pads having a top surface narrower than a bottom surface in cross-section width by an etching process, provide a semiconductor chip having connection bumps larger in size and lower in rigidity than the solder pads, allowing the semiconductor chip to be electrically connected to the substrate by compressing the connection bumps and the solder pads to engage the connection bumps with the solder pads, so as to reduce the stress between the substrate and the semiconductor chip, enhance the bonding strength of the solder pads and the connection bumps, and increase the fabrication reliability by the engagement structure of the solder pads and the connection bumps.

Moreover, the present invention transforms the drawback of the conventional wet etching into the advantage of the present invention, i.e., using a thicker metal layer in performing the wet etching process so as to form the substrate having fine wires suitable for bonding with a flip-chip semiconductor chip and high reliability, thereby omitting the drawbacks of poor reliability caused by using thin metal layer in the wet etching process and avoiding increased costs and poor etching selectivity as encountered in the dry etching technique.

BRIEF DESCRIPTION OF THE DRAWINGS

The present invention can be more fully understood by reading the following detailed description of the preferred embodiments, with reference made to the accompanying drawings, wherein.

DETAILED DESCRIPTION OF THE PREFERRED EMBODIMENTS

The present invention is described in the following with specific embodiments, such that one skilled in the pertinent art can easily understand other advantages and effects of the present invention from the disclosure of the invention. The present invention may also be implemented and applied according to other embodiments, and the details may be modified based on different views and applications without departing from the spirit of the invention.

It should be understood that the fabrication method of the present invention includes providing a semiconductor chip having an inner circuit and a plurality of connection bumps electrically connected to the inner circuit, and a substrate having a plurality of solder pads formed by wet etching a conductive metal layer for being electrically connected to the connection bumps; flipping the semiconductor chip to make the connection bumps correspond to the solder pads in position; and compressing the substrate and the semiconductor chip toward each other at a temperature of the compression between the connection bumps and the solder pads lower than the melting points of the solder pads and the connection bumps, such that the solder pads are embedded into the connection bumps. The semiconductor device of the present invention comprises: a semiconductor chip having an inner circuit and a plurality of connection bumps for electrically connecting the inner circuit; and a substrate having a plurality of solder pads for electrically connecting the connection bumps, allowing the semiconductor chip and the substrate to be electrically connected to each other by compression between the connection bumps and the solder pads, wherein the solder pads are made of a conductive metal with a rigidity higher than that of the connection bumps and formed on the substrate by wet etching, so as for the solder pads to be embedded into the connection bumps upon completion of the compression, and a temperature of the compression between the connection bumps and the solder pads is lower than melting points of the solder pads and the connection bumps. The following embodiments serve an illustrative purpose but are not to limit the scope of disclosure and application of the present invention.

Please refer to FIGS. 3A to 3F, which are schematic diagrams illustrating a fabrication method of a semiconductor device according to the present invention.

Figure 1:
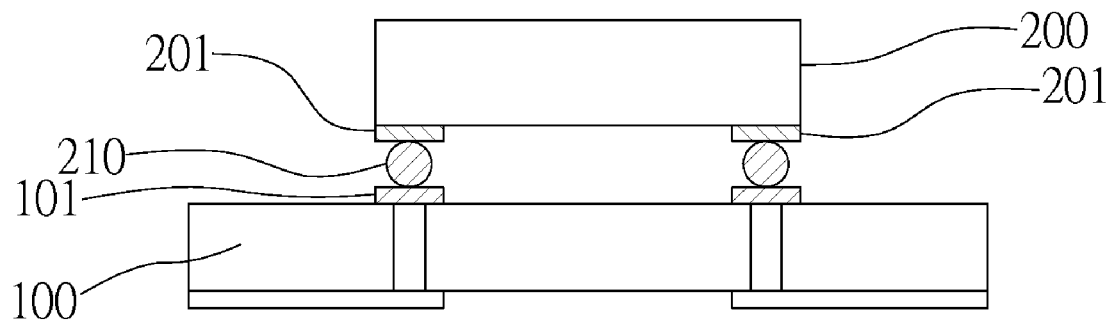
FIGS. 1 and 2 are schematic diagrams of a semiconductor device according to the prior art.
Figure 2:
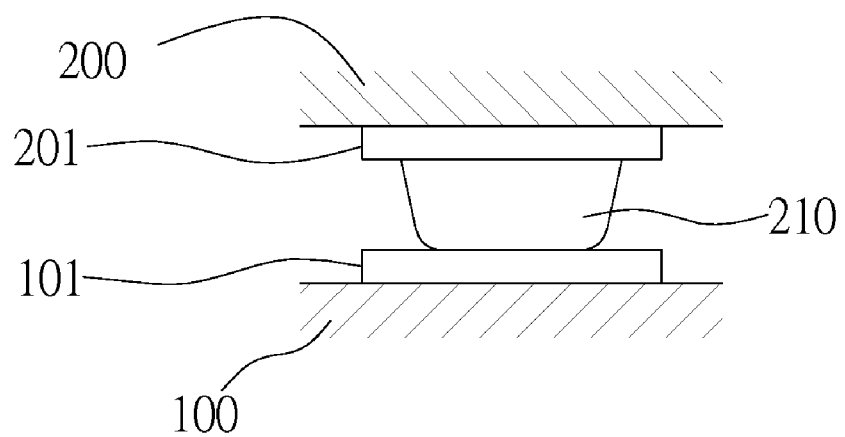
Figure 3A:
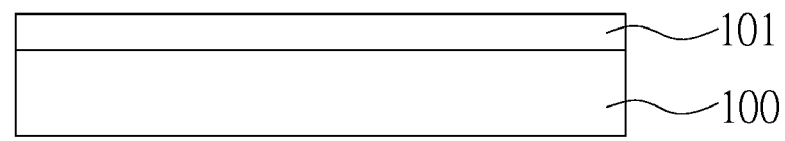
FIGS. 3A to 3G are cross-sectional views illustrating a fabrication method of a semiconductor device according to the present invention.
Figure 3B:
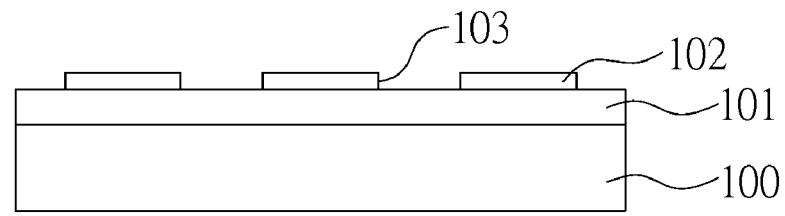

As shown in FIGS. 3A and 3B, a core board 100 is provided, a metal layer 101 made of copper, nickel, or nickel-copper alloy is formed on a surface of the core board 100. Subsequently, a photoresist layer 102 is formed on the metal layer 101, and the photoresist layer 102 is subjected to a patterning process of exposure and development in order to form a plurality of openings 103 for exposing portions of the metal layer 101.

Figure 3C:
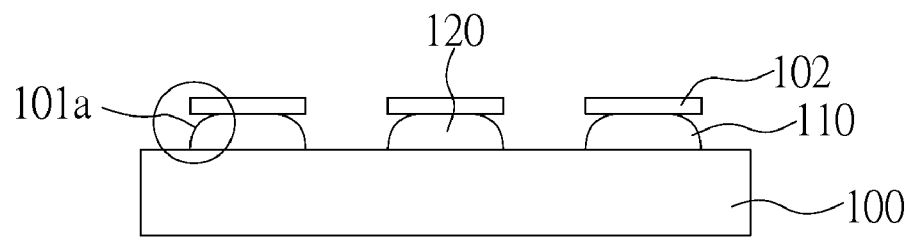

As shown in FIG. 3C, an acid or alkali liquid etchant is selected to etch and remove portions of the metal layer 101 exposed from the openings 103, thereby forming a plurality of patterned solder pads 110 and circuit layers 120 on the core board 100 (the core board 100 may have the patterned solder pads 110 only) to form a package substrate 100' on which a semiconductor chip 200 may be mounted subsequently. Etching removal is accomplished by the diffusion effect of the liquid etchant and chemical reaction of the surface molecules on the metal layer 101 that are exposed from the openings 103.

Figure 3D:
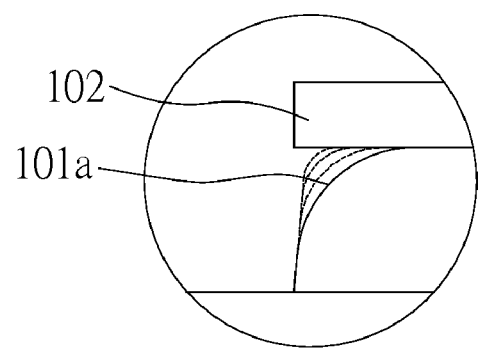
Figure 3E:
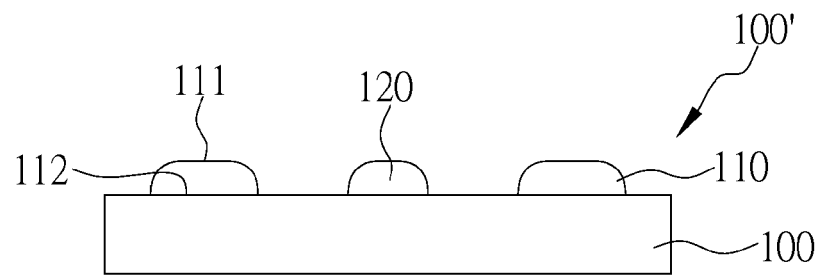
Figure 3F:
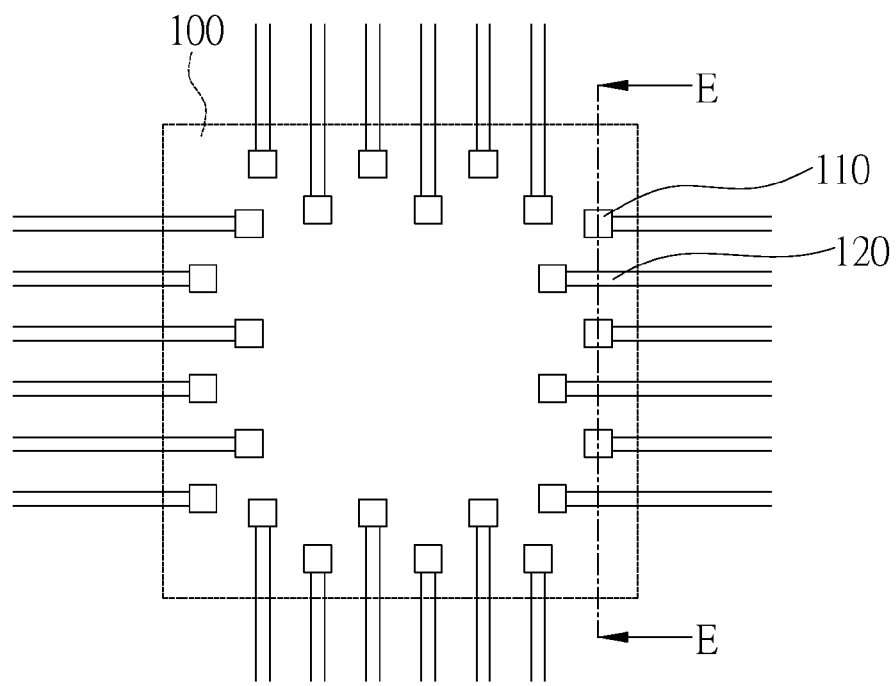

As illustrated in FIGS. 3D and 3F, when the exposed metal layer 101 is removed by the liquid etchant in the etching process, the metal layer 101 exposed from the opening 103 and a contact surface 101a of the photoresist layer 102 are etched over a long period of time due to the diffusion effect of the etchant such that the contact surface 101a under the photoresist layer 102 is more profoundly affected and deeply etched than other areas. Therefore, after the etching process is completed and the photoresist 102 is removed, the solder pad 110 and the circuit layer 120 have convex cross sections, i.e., the solder pad 110 and the circuit layer 120 respectively have a bottom surface 112 wider than a top surface 111 in cross-section.

Figure 3G:
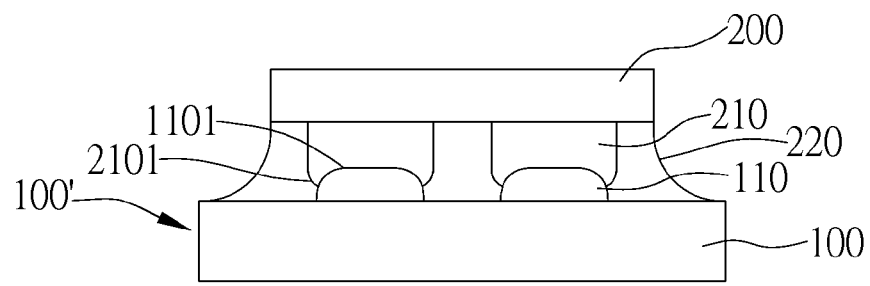

As shown in FIG. 3G, a semiconductor chip 200 is provided, a plurality of chip pads (not shown) are formed on an active surface of the semiconductor chip 200, and metal bumps 210 are further formed on the chip pads of the semiconductor chip 200 as connection bumps. The metal bump 210 is made of a material of hardness less than that of the solder pad 110, and the material is, for example, solder tin or gold. The dimensions of the metal bump 210 are greater than that of a top surface of the solder pad 110 of the substrate 100'. The metal bump 210, when implemented in the form of a connection bump, has a first contact end 2101, and the solder pad 110 has a second contact end 1101 connected to the first contact end 2101 and smaller in area than the first contact end 2101.

In other words, in other embodiments, the compressing contact surfaces, which are in parallel or not in parallel, of the solder pad 110 and the metal bump 210 can have different sizes, as long as the first contact end 2101 is wider than the second contact end 1101. Besides, the connection bump in this embodiment is the metal bump 210, but it can be of other material.

Subsequently, the metal bump 210 implemented in the form of the connection bump is rendered corresponding to the solder pad 110 in position by flipping the semiconductor chip 200. In the present embodiment, the semiconductor chip 200 having the metal bump 210 is compressed toward the substrate 100' having the solder pad 110 formed thereon by the flip-chip technique through either one of the processes of compression, thermal compression, or thermal sonic compression, thereby allowing the substrate 100' to be electrically connected to the semiconductor chip 200.

With the metal bump 210 being greater in size and yet lower in rigidity than the solder pad 110, the semiconductor chip 200 and the substrate 100' are engaged with and electrically connected to each other by the compressing process, and the solder pad 110 and the metal bump 210 together form a corresponding concave-convex structure, so as to reinforce the bonding of the solder pad 110 and the semiconductor chip 200, reduce the stress between the substrate 100' and the semiconductor chip 200, and upgrade the fabrication reliability of semiconductor devices to be formed subsequently.

In the present embodiment, the temperature of compression between the metal bump 210 and the solder pad 110 is lower than the melting points of the solder pad and the metal bump. For example, solder tin, gold, copper, and nickel have melting points of 183° C., 1063° C., 1083° C., and 1453° C., respectively, and nickel-copper alloy has a melting point of 1083-1455° C. (depending on the ratio of nickel to copper). Accordingly, in the present embodiment, the temperature of compression ranges from 50° C. to 180° C. However, if different metal bump 210 and solder pad 110 are used, persons of ordinary skill in the art will know that the aforesaid range changes accordingly, as long as the temperature of compression between the metal bump 210 and the solder pad 110 is lower than the melting points of the solder pad and the metal bump. The pressure and timing control relating to the compression are known in the art, detailed description is hereby omitted.

Further, please note that the hardness of the metal bump 210 and the hardness of the solder pad 110 are not limited to the above embodiments. The metal bump 210 can be higher in rigidity than the solder pad 110, enabling the metal bump 210 to be embedded into the solder pad 110. Accordingly, the metal bump 210 is smaller than the solder pad 110 in size, and is not limited to the restriction that the top surface of the solder pad 110 is smaller in area than the bottom surface of the solder pad 110, and the restriction that the metal bump 210 is greater in size and higher in rigidity than the solder pad 110.

Further, a flip-chip underfill material 220 may be formed between the semiconductor chip 200 and the substrate 100', thereby protecting the metal bump 210 and also increasing mechanical bonding strength between the semiconductor chip 200 and the substrate.

Figure 4A:
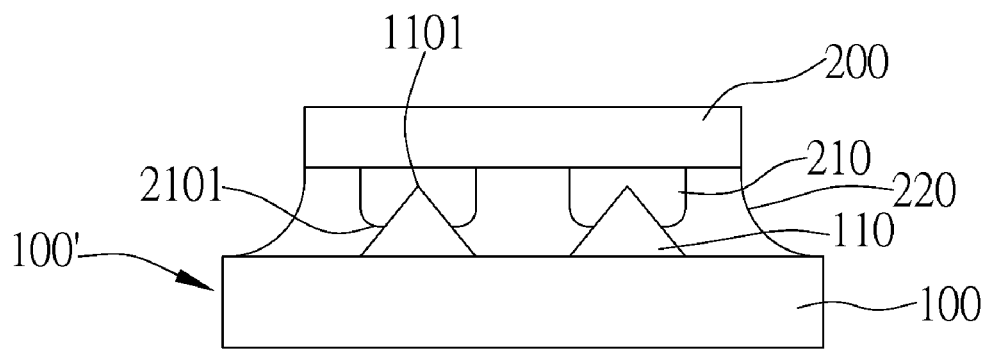
FIGS. 4A to 4C are schematic diagrams of variants of the present invention.
Figure 4B:
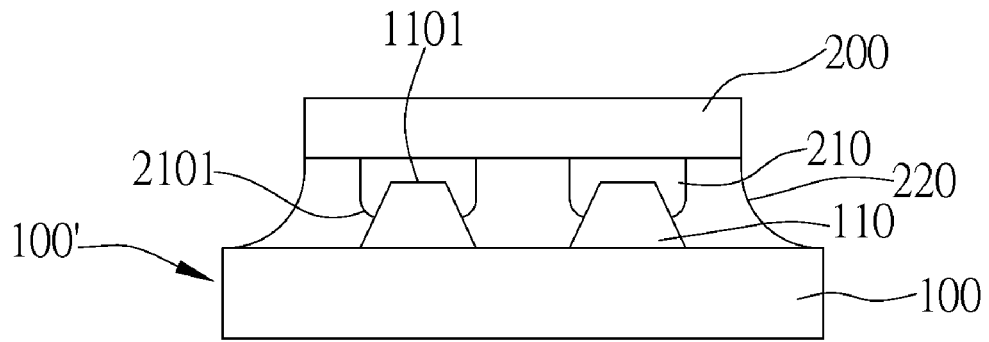
Figure 4C:
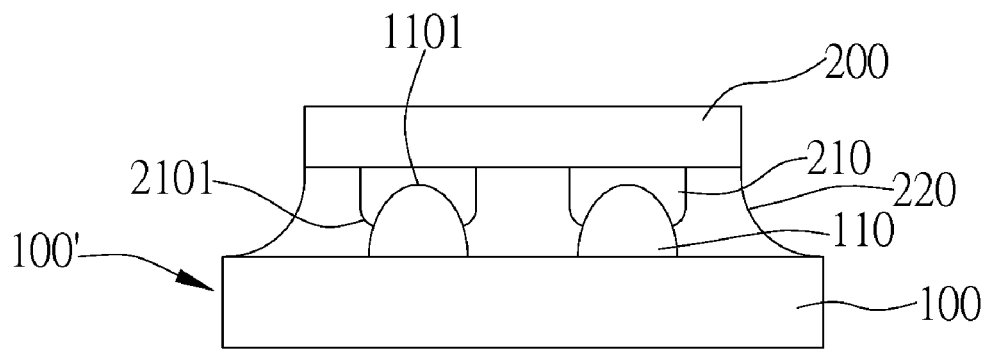

Further referring to FIGS. 4A to 4C, which are variants of the present invention, the compressing contact surfaces of the solder pad 110 and the metal bump 210 can be in parallel (as shown in FIGS. 4B and 4C) or not in parallel (as shown in FIG. 4A) and have different sizes, as log as the first contact end 2101 is wider than the second contact end 1101. Herein please note that the shape of the solder pad 110 or the circuit layer 120 is not limited to the cone shape as illustrated in the previous embodiment. By selecting a liquid etchant or controlling the time of etching, the solder pad 110 or the circuit layer 120 may have differing shapes such as triangular (as shown in FIG. 4A, representing the shape of solder pad 110 only), trapezoidal (as shown in FIG. 4B, representing the shape of solder pad 110 only) or warhead-shaped (as shown in FIG. 4C, representing the shape of solder pad 110 only), all of which have their top surface smaller in area than their bottom surface.

By the fabrication method described above, the present invention also proposes a semiconductor device comprising a substrate 100' on which a plurality of solder pads 110 are formed by wet etching, and a semiconductor chip 200 having an active surface on which a plurality of metal bumps 210 are formed for electrically connecting the semiconductor chip 200 and the substrate 100' with the solder pad 110 by a compressing process. The temperature of compression between the metal bump 210 and the solder pad 110 is lower than the melting points of the solder pad 110 and the metal bump 210. Further, in the present embodiment, the top surface of the solder pad 110 is smaller in area than the bottom surface of the solder pad 110. However, persons of ordinary skill in the art know that it is also allowed as long as the first contact end 2101 is larger than the second contact end 1101.

Therefore, the semiconductor device and the fabrication method thereof can employ the conventional wet etching process to form a convex-shaped solder pad on the substrate such that the top surface of each of the solder pads is larger in area than the bottom surface of each of the solder pads. The substrate having the solder pads is connected with the semiconductor chip having connection bumps by compression. The connection bumps can be metal bumps. If the connection bumps are the metal bumps, the metal bumps are greater in size and higher in rigidity than the solder pads, allowing the semiconductor chip and the substrate to be engaged with and electrically connected to each other by the compressing process. The temperature of the compression between the metal bumps and the solder pads is lower than the melting points of the solder pads and the metal bumps. Compared with the prior art, the present invention increases the bonding strength of the solder pads and the metal bumps and increases the product reliability of the semiconductor device to be fabricated subsequently by above-mentioned engaging structure.

Moreover, the present invention transforms the drawback of the convention wet etching into the advantage of the present invention, i.e., employing thicker metal layer to perform the wet etching process to form the substrate having fine wires suitable for bonding with a flip-chip semiconductor chip and high reliability, thereby omitting the drawbacks of poor reliability caused by using thin metal layer in the wet etching process and avoiding increased costs and poor etching selectivity as encountered in the dry etching technique.

The invention has been described using exemplary preferred embodiments. However, it is to be understood that the scope of the invention is not limited to the disclosed embodiments. On the contrary, it is intended to cover various modifications and similar arrangements. The scope of the claims, therefore, should be accorded the broadest interpretation so as to encompass all such modifications and similar arrangements.

What is claimed is:

1. A fabrication method of a semiconductor device, comprising the steps of:

providing a semiconductor chip having an inner circuit and a plurality of connection bumps electrically connected to the inner circuit, and a substrate having a plurality of circuit layers formed thereon by wet etching and a plurality of solder pads formed by wet etching a conductive metal layer for being electrically connected to the connection bumps;

flipping the semiconductor chip to enable the connection bumps to correspond to the solder pads in position; and compressing the substrate and the semiconductor chip toward each other at a temperature of the compression between the connection bumps and the solder pads lower than the melting points of the solder pads and the connection bumps, such that the solder pads are embedded into the connection bumps, wherein the substrate is formed by wet etching a surface of a core board so as to form the solder pads on the surface of the core board, and a top surface of each of the circuit layers is smaller in area than a bottom surface of each of the circuit layers.

2. The fabrication method of claim 1, wherein each of the solder pads has a cross section in a convex shape.

3. The fabrication method of claim 1, wherein a top surface of each of the solder pads is smaller in area than a bottom surface of each of the solder pads.

4. The fabrication method of claim 1, wherein a cross section of each of the solder pads is in a shape selected from the group consisting of cone, triangle, trapezoid and warhead.

5. The fabrication method of claim 1, wherein each of the connection bumps has a first contact end, and each of the solder pads has a second contact end correspondingly connected to the first contact end and narrower than the first contact end in width.

6. The fabrication method of claim 1, wherein a cross section of each of the circuit layers is in a shape selected from the group consisting of cone, triangle, trapezoid, and warhead.

7. The fabrication method of claim 1, wherein the connection bumps of the semiconductor chip and the solder pads of the substrate are compressed by a thermal compression or thermal sonic compression process.

8. The fabrication method of claim 1, wherein the temperature of the compression between the connection bumps and the solder pads ranges from 50° C. to 180° C.

9. The fabrication method of claim 1, wherein the connection bumps are lower in rigidity than the solder pads on the substrate.

10. The fabrication method of claim 9, wherein the connection bumps are metal bumps made of solder tin or gold.

11. The fabrication method of claim 9, wherein the solder pads are made of a metallic material selected from the group consisting of copper, nickel, and nickel-copper alloy.

12. The fabrication method of claim 1, wherein a flip-chip underfill material is filled between the semiconductor chip and the substrate.

13. The fabrication method of claim 1, wherein the formation of the substrate comprises the steps of:

forming the conductive metal layer on a core board;

forming on the conductive metal layer a photoresist layer having a plurality of openings for exposing a portion of the conductive metal layer; and removing the conductive metal layer exposed from the openings by using an etching solution, followed by removing the photoresist layer, so as to form the solder pads on the core board to thereby allow the core board and solder pads thereon together to form the substrate.

14. The fabrication method of claim 13, wherein top surfaces of the solder pads are smaller in area than bottom surfaces of the solder pads.

* * * * *